(12) United States Patent
Song et al.

(10) Patent No.: US 12,414,389 B2
(45) Date of Patent: Sep. 9, 2025

(54) ARRAY SUBSTRATE AND DISPLAY PANEL

(71) Applicant: WUHAN CHINA STAR OPTOELECTRONICS TECHNOLOGY CO., LTD., Hubei (CN)

(72) Inventors: Jiyue Song, Hubei (CN); Fei Ai, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/905,173

(22) PCT Filed: Aug. 8, 2022

(86) PCT No.: PCT/CN2022/110821
§ 371 (c)(1),
(2) Date: Aug. 28, 2022

(87) PCT Pub. No.: WO2024/021152
PCT Pub. Date: Feb. 1, 2024

(65) Prior Publication Data
US 2024/0204012 A1   Jun. 20, 2024

(30) Foreign Application Priority Data
Jul. 28, 2022 (CN) .......................... 202210901014.5

(51) Int. Cl.
*H10F 39/10* (2025.01)
*H10D 86/40* (2025.01)
*H10D 86/60* (2025.01)

(52) U.S. Cl.
CPC ......... *H10F 39/107* (2025.01); *H10D 86/451* (2025.01); *H10D 86/60* (2025.01)

(58) Field of Classification Search
CPC ............. H01L 27/1446; H01L 27/1248; H01L 27/1214; H01L 27/1259; H01L 27/156;
(Continued)

(56) References Cited

U.S. PATENT DOCUMENTS

2003/0025127 A1* 2/2003 Yanai ................. H10D 30/0314
257/E29.279
2003/0189207 A1 10/2003 Murakami
(Continued)

FOREIGN PATENT DOCUMENTS

| CN | 112612165 A | 4/2021 |
| CN | 113327953 A | 8/2021 |

(Continued)

OTHER PUBLICATIONS

International Search Report in International application No. PCT/CN2022/110821, mailed on Dec. 22, 2022.
(Continued)

*Primary Examiner* — Sitaramarao S Yechuri
(74) *Attorney, Agent, or Firm* — PV IP PC; Wei Te Chung (57) ABSTRACT

An array substrate and a display panel are provided. The array substrate includes a substrate, an active layer, a first insulating layer, and a first opening. The active layer is disposed on a side of the substrate and includes a first active portion and a second active portion. The first insulating layer is disposed on a side of the active layer away from the substrate and covers the active layer. The first opening is formed on the first active portion. The first opening exposes the first insulating layer. An integration of a pixel driving element and a photosensitive element on the array substrate is realized, and a photosensitive performance of the photosensitive element is improved.

15 Claims, 4 Drawing Sheets

(58) Field of Classification Search
CPC .............. H01L 29/786; G02F 1/1362; G02F 1/136277; H10F 39/107; H10D 86/451; H10D 86/60; H10D 86/021; H10D 86/40; H10D 30/67; H10H 29/142
See application file for complete search history.

(56) References Cited

U.S. PATENT DOCUMENTS

| | | | |
|---|---|---|---|
| 2004/0206956 A1* | 10/2004 | Yanai ............... | H10D 30/0321 257/E29.279 |
| 2010/0012940 A1* | 1/2010 | Sato ................. | H10D 86/427 438/22 |
| 2016/0351724 A1* | 12/2016 | Zhao ................ | H10D 30/031 |
| 2017/0047449 A1 | 2/2017 | Takechi | |
| 2021/0184144 A1* | 6/2021 | Jongman ........... | H10K 10/80 |
| 2021/0399142 A1* | 12/2021 | Jeong ............... | H10D 86/451 |

FOREIGN PATENT DOCUMENTS

| | | | |
|---|---|---|---|
| CN | 113362721 A | | 9/2021 |
| CN | 113488507 A | | 10/2021 |
| CN | 114122017 A | | 3/2022 |
| KR | 20190073902 A | * | 6/2019 |
| WO | 2019206027 A1 | | 10/2019 |

OTHER PUBLICATIONS

Written Opinion of the International Search Authority in International application No. PCT/CN2022/110821, mailed on Dec. 22, 2022.
Chinese Office Action issued in corresponding Chinese Patent Application No. 202210901014.5 dated Apr. 27, 2025, pp. 1-7.

* cited by examiner

ARRAY SUBSTRATE AND DISPLAY PANEL

FIELD OF DISCLOSURE

The present disclosure relates to the field of displays, in particular to an array substrate and a display panel.

BACKGROUND

Photoelectric detection sensors can be used for non-contact measurement, fingerprint identification, ambient light detection, ultraviolet and infrared detection, communication, and other aspects.

In sensing technologies of existing display panels, photosensitive sensors mostly adopt an external hanging method. A display device and a sensor device need to be processed separately, and then the display device and the sensor device layer are bonded together with an optical adhesive. In this way, a production process is complicated, and a production cost is high, which is not conducive to industrialization.

In the prior art, a photosensitive sensor device with an in-screen structure is proposed, and the display device and the photosensitive device are formed on a same substrate. Compared with the traditional technology, the complexity of the process can be appropriately reduced. However, when the display device and the sensor device are made on the same substrate, a design of the sensor device is limited due to constraints of performances of the display device and the sensor device and an actual layout, and it is difficult for the sensor device to achieve a desired effect.

SUMMARY OF DISCLOSURE

The present disclosure provides an array substrate and a display panel, which integrate a display device and a photosensitive device in a same array substrate to improve a photosensitive performance of the photosensitive device.

The present disclosure provides an array substrate, and the array substrate includes:
  a substrate;
  an active layer disposed on a side of the substrate and including a first active portion and a second active portion;
  a first insulating layer disposed on a side of the active layer away from the substrate and covering the active layer; and
  a first opening formed on the first active portion, where the first opening exposes the first insulating layer.

Alternatively, in some embodiments of the present disclosure, a surface of the first insulating layer away from the substrate includes a first surface and a second surface, the first surface is a bottom surface of the first opening, the second surface surrounds the first surface, and the first surface is recessed relative to or flush with the second surface.

Alternatively, in some embodiments of the present disclosure, the first surface includes a third surface and a fourth surface, the fourth surface surrounds the third surface, the second surface surrounds the fourth surface, the fourth surface is recessed relative to the third surface and the second surface, and the third surface is recessed relative to the second surface.

Alternatively, in some embodiments of the present disclosure, a recessed depth of the fourth surface relative to the second surface ranges from 50 micrometers to 200 micrometers, and a recessed depth of the third surface relative to the second surface ranges from 50 micrometers to 150 micrometers.

Alternatively, in some embodiments of the present disclosure, the array substrate further includes a second insulating layer and a third insulating layer, the second insulating layer and the third insulating layer are sequentially arranged on the first insulating layer, and the first opening extends through the second insulating layer and the third insulating layer.

Alternatively, in some embodiments of the present disclosure, the first active portion is further provided with a second opening, the second opening extends through the first insulating layer and the second insulating layer, and exposes the first active portion, and an opening diameter of the first opening is greater than an opening diameter of the second opening.

Alternatively, in some embodiments of the present disclosure, the third insulating layer is provided with a third opening, the third opening extends through the third insulating layer, and the opening diameter of the first opening is greater than an opening diameter of the third opening.

Alternatively, in some embodiments of the present disclosure, the array substrate further includes a first conductive layer, the first conductive layer includes a first electrode and a second electrode, and the first electrode and the second electrode are respectively connected to both ends of the first active portion through the second openings.

Alternatively, in some embodiments of the present disclosure, the first conductive layer further includes a third electrode and a fourth electrode, and the third electrode and the fourth electrode are respectively connected to both ends of the second active portion through the second openings.

Alternatively, in some embodiments of the present disclosure, the array substrate further includes a transparent conductive layer, the transparent conductive layer is disposed on the third insulating layer, the transparent conductive layer includes a first transparent electrode, and the first transparent electrode covers the first opening.

Alternatively, in some embodiments of the present disclosure, the transparent conductive layer further includes a second transparent electrode, and the second transparent electrode is connected to the third electrode or the fourth electrode through the third opening.

Alternatively, in some embodiments of the present disclosure, the first transparent electrode is electrically connected to the first electrode or the second electrode.

Alternatively, in some embodiments of the present disclosure, the first transparent electrode covers a bottom surface and a side surface of the first opening and extends to a surface of the third insulating layer, and the first transparent electrode is connected to the first electrode or the second electrode through the third opening.

Alternatively, in some embodiments of the present disclosure, the array substrate further includes a second conductive layer, the second conductive layer is disposed between the first insulating layer and the second insulating layer, the second conductive layer includes a fifth electrode, and a projection of the fifth electrode on the substrate partially overlaps a projection of a channel region of the second active portion on the substrate.

Alternatively, in some embodiments of the present disclosure, the first active portion includes a first channel region and two first doped regions, the two first doped regions are respectively arranged on both sides of the first channel region, and a projection of a bottom surface of the first opening on the substrate covers a projection of the first channel region on the substrate.

Alternatively, in some embodiments of the present disclosure, the array substrate further includes a reflective layer disposed between the substrate and the active layer, the reflective layer includes a first reflective portion, and a projection of the first active portion on the substrate is within a projection of the first reflective portion on the substrate.

Alternatively, in some embodiments of the present disclosure, the reflective layer further includes a second reflective portion, and a projection of the second active portion on the substrate is within a projection of the second reflective portion on the substrate.

Alternatively, in some embodiments of the present disclosure, the array substrate includes a pixel driving element and a photosensitive element, the photosensitive element includes the first active portion, and the pixel driving element including the second active portion.

Alternatively, in some embodiments of the present disclosure, material of the active layer is a low temperature polysilicon layer.

Meanwhile, an embodiment of the present disclosure provides a display panel including the array substrate described in any one of the embodiments of the present disclosure.

The present disclosure provides the array substrate and the display panel. By arranging a semiconductor structure of the pixel driving element and a semiconductor structure of the photosensitive element in the same active layer, an integration of the pixel driving element and the photosensitive element on the array substrate is realized. Meanwhile, the first opening is formed in the photosensitive element, and the first opening corresponds to the semiconductor structure of the photosensitive element. A photosensitive area of the photosensitive element and a light transmittance of a photosensitive side of the photosensitive element are improved, thereby improving the photosensitive performance of the photosensitive element.

BRIEF DESCRIPTION OF DRAWINGS

The technical solutions and other beneficial effects of the present disclosure will be apparent through the detailed description of the specific embodiments of the present disclosure with reference to the accompanying drawings.

DETAILED DESCRIPTION

The present disclosure provides an array substrate to solve problems that a display device and a sensor device are formed on a same substrate, a design of the sensor device is limited and the sensor device is difficult to achieve due effects.

Figure 1:
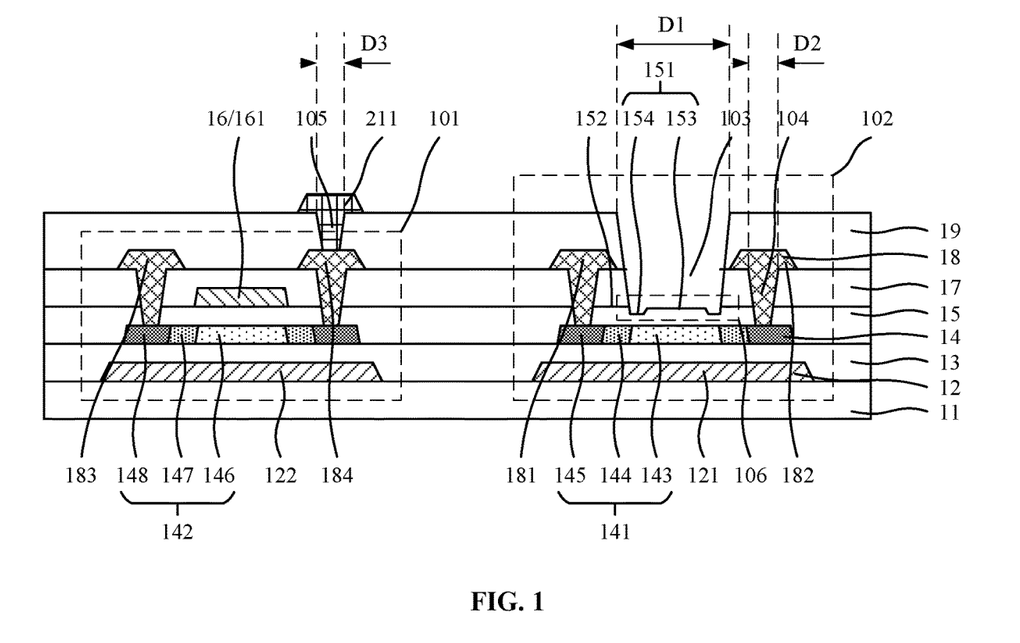
FIG. 1 is a first structure schematic diagram of an array substrate of an embodiment of the present disclosure.
Figure 2:
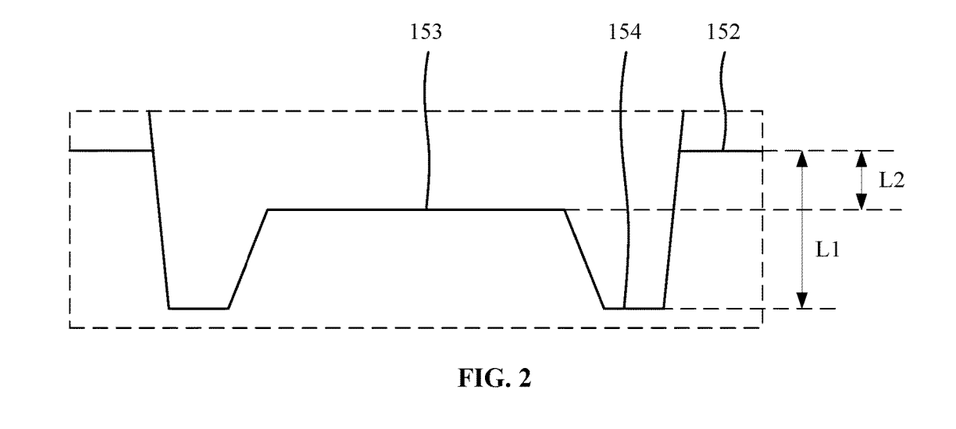
FIG. 2 is an enlarged structural schematic diagram of 106 region in FIG. 1.
Figure 3:
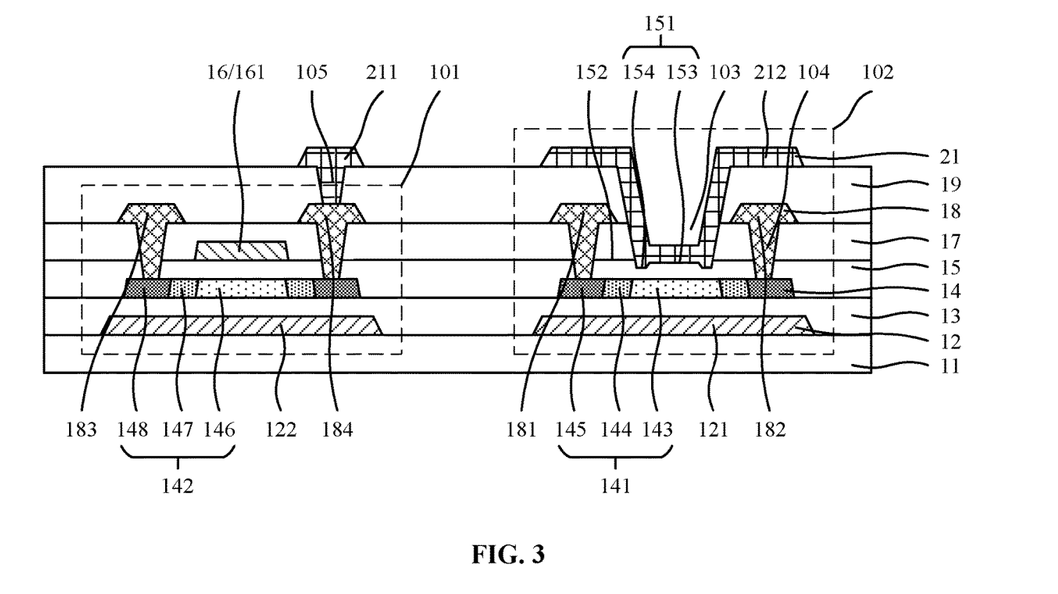
FIG. 3 is a second structure schematic diagram of an array substrate of an embodiment of the present disclosure.
Figure 4:
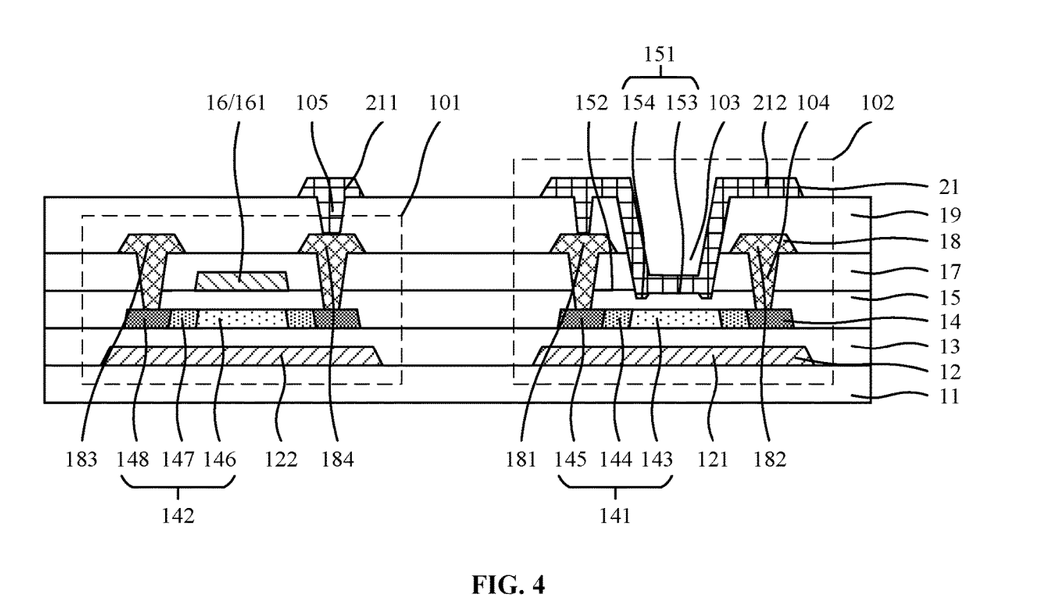
FIG. 4 is a third structure schematic diagram of an array substrate of an embodiment of the present disclosure.

In one embodiment, refer to FIG. 1 to FIG. 4, FIG. 1 is a first structure schematic diagram of an array substrate of an embodiment of the present disclosure, FIG. 2 is an enlarged structural schematic diagram of 106 region in FIG. 1, FIG. 3 is a second structure schematic diagram of an array substrate of an embodiment of the present disclosure, and FIG. 4 is a third structure schematic diagram of an array substrate of an embodiment of the present disclosure. As shown in FIG. 1 to FIG. 4, the array substrate includes:

a substrate 11;

an active layer 14 disposed on a side of the substrate 11 and including a first active portion 141 and a second active portion 142;

a first insulating layer 15 disposed on a side of the active layer 14 away from the substrate 11 and covering the active layer 14; and a first opening 103 formed on the first active portion 141, where the first opening 103 exposes the first insulating layer 15.

The embodiment of the present disclosure provides the array substrate. By arranging a semiconductor structure of a pixel driving element and a semiconductor structure of a photosensitive element in the same active layer, an integration of the pixel driving element and the photosensitive element on the array substrate is realized. Meanwhile, the first opening is formed in the photosensitive element, and the first opening corresponds to the semiconductor structure of the photosensitive element. A photosensitive area of the photosensitive element and a light transmittance of a photosensitive side of the photosensitive element are improved, thereby improving the photosensitive performance of the photosensitive element.

Embodiment 1

Referring to FIG. 1, the array substrate provided by the embodiment of the present disclosure includes a pixel driving element 101 and a photosensitive element 102. The first active portion 141 is a semiconductor structure of the photosensitive element 102, and the second active portion 142 is a semiconductor structure of the pixel driving element 101. The first active portion 141 includes a first channel region 143 and first doped regions. The first doped regions are arranged on both sides of the first channel region 143. The first doped regions include a first lightly doped region 144 and a first heavily doped region 145. The first lightly doped region 144 is connected to the first heavily doped region 145 and the first channel region 143. A projection of a bottom surface of the first opening 103 on the substrate 11 covers a projection of the first channel region 143 on the substrate 11 to increase a light sensitivity of the first channel region 143. Similarly, the second active portion 142 includes a second channel region 146 and second doped regions. The second doped regions are arranged on both sides of the second channel region 146. The second doped region includes a second lightly doped region 147 and a second heavily doped region 148. The second lightly doped region 147 connects the second heavily doped region 148 and the second channel region 146. In one embodiment, material of the active layer is a low temperature polysilicon layer.

The first insulating layer 15 is a transparent insulating layer, and material of the first insulating layer 15 is usually a transparent inorganic insulating material such as silicon oxide, silicon nitride, and silicon oxynitride.

Referring to FIG. 1 and FIG. 2, FIG. 2 is an enlarged structural schematic diagram of 106 region in FIG. 1. A surface of the first insulating layer 15 away from the substrate 11 includes a first surface 151 and a second surface 152. The first surface 151 corresponds to the bottom surface of the first opening 103. The second surface 152 surrounds the first surface 151. The first surface 151 is recessed relative to or flush with the second surface 152. The first surface 151 further includes a third surface 153 and a fourth surface 154. The fourth surface 154 surrounds the third surface 153. The second surface 152 surrounds the fourth surface 154. The fourth surface 154 is recessed relative to the third surface 153 and the second surface 152. The third surface 153 is flush with or recessed relative to the second surface 152. A recessed depth L1 of the fourth surface 154 relative to the second surface 152 ranges from 50 micrometers to 200 micrometers. A recessed depth L2 of the third surface 153 relative to the second surface 152 ranges from 50 micrometers to 150 micrometers.

The array substrate further includes a second insulating layer 17 and a third insulating layer 19. The second insulating layer 17 and the third insulating layer 19 are disposed on the first insulating layer 15 in sequence. The first opening 103 extends through the second insulating layer 17 and the third insulating layer 19. A projection of the first surface 151 on the substrate 11 covers a projection of the first channel region 143 on the substrate 11. Both the first active portion 141 and the second active portion 142 are provided with second openings 104. The second openings 104 extend through the first insulating layer 15 and the second insulating layer 17 and expose the two first heavily doped regions 145 of the first active portion 141 and the two second heavily doped regions 148 of the second active portion 142. A third opening 105 is also provided on the third insulating layer 19. The third opening 105 extends through the third insulating layer 19. An opening diameter D1 of the first opening 103 is greater than an opening diameter D2 of the second opening 104. The opening diameter D1 of the first opening 103 is greater than an opening diameter D3 of the third opening 105.

The array substrate further includes a first conductive layer 18 and a third insulating layer 19. The first conductive layer 18 is disposed between the second insulating layer 17 and the third insulating layer 19. The first conductive layer 18 includes a first electrode 181, a second electrode 182, a third electrode 183, and a fourth electrode 184. The third electrode 183 and the fourth electrode 184 are respectively connected to two ends of the second active portion 142, and specifically connected to the two second heavily doped regions 148 through the second openings 104, respectively. The third electrode 183 and the fourth electrode 184 are respectively a source and a drain of the pixel driving element, or the third electrode 183 and the fourth electrode 184 are respectively the drain and the source of the pixel driving element. The first electrode 181 and the second electrode 182 are electrically connected to two ends of the first active portion 141, respectively, and are specifically connected to the two first heavily doped regions 145 through the second openings 104, respectively.

The array substrate also includes a transparent conductive layer 21. The transparent conductive layer 21 is disposed on a side of the third layer 19 away from the second insulating layer 17. The transparent conductive layer 21 includes a second transparent electrode 211. The second transparent electrode 211 is connected to the fourth electrode 184 through the third opening 105. Material of the transparent conductive layer 21 includes, but is not limited to, indium tin oxide, indium zinc oxide, indium gallium zinc oxide, and the like.

In this embodiment, the photosensitive element 102 is a photosensitive diode. The photosensitive element 102 is set as the photosensitive diode, and the first opening 103 is formed at a photosensitive side of the semiconductor structure of the photosensitive diode. Therefore, there is no light-shielding layer on the photosensitive side of the photosensitive diode, which increases a light-receiving area of the photosensitive diode and improves the photosensitive performance of the photosensitive diode.

The array substrate also includes a second conductive layer 16. The second conductive layer 16 is disposed between the first insulating layer 15 and the second insulating layer 17. The second insulating layer 17 is disposed between the second conductive layer 16 and the first conductive layer 18. The second conductive layer 16 includes a fifth electrode 161. A projection of the fifth electrode 161 on the substrate 11 overlaps a projection of the second channel region 146 on the substrate 11. The fifth electrode 161 is a gate of the pixel driving element 101.

Furthermore, the array substrate further includes a reflective layer 12 and a buffer layer 13. The reflective layer 12 is disposed between the substrate 11 and the active layer 14. The buffer layer 13 is disposed between the reflective layer 12 and the active layer 14. The reflective layer 12 includes a first reflective portion 121 and a second reflective portion 122. A projection of the first active portion 141 on the substrate 11 is within a projection of the first reflective portion 121 on the substrate 11. A projection of the second active portion 142 on the substrate 11 is within a projection of the second reflective portion 122 on the substrate 11. The second reflective portion 122 is configured to shield the light entering from the substrate 11 to affect the second active portion 142. The first reflective portion 121 is configured to shield the light entering from the substrate 11 to affect the first active portion 141, and to reflect the light entering from the first insulating layer 15 to the first active portion 141, such that the photosensitive amount of the first active portion 141 is increased, and the photosensitive performance of the photosensitive element 102 is improved. Material of the reflective layer 12 is preferably a metal material with good reflectivity or an alloy thereof.

If the pixel driving element 101 is a thin film transistor with a bottom gate structure, the second conductive layer is disposed between the substrate and the active layer 14, and the second insulating layer is disposed between the second conductive layer and the active layer 14. The second conductive layer includes the fifth electrode and a light-reflecting electrode. A projection of the fifth electrode on the substrate 11 overlaps a projection of the second channel region 146 on the substrate 11. A projection of the light-reflecting electrode on the substrate 11 covers a projection of the first channel region 143 on the substrate 11. The light-reflecting electrode is configured to shield the light entering from the substrate 11 to affect the first active portion 141, and to reflect the light entering from the first insulating layer 15 to the first active portion 141, so the photosensitive amount of the first active portion 141 is increased, and the photosensitive performance of the photosensitive element 102 is improved.

Embodiment 2

Referring to FIG. 3, in this embodiment, a basic structure of an array substrate is similar to that in the first embodiment, and the similar structure will not be described in detail here. For details, refer to the above-mentioned Embodiment 1. Compared with the above-mentioned Embodiment 1, this embodiment is different in that the photosensitive element 102 is a thin film transistor with a transparent top-gate structure. The transparent conductive layer 21 includes a second transparent electrode 211 and a first transparent electrode 212. The first transparent electrode 212 covers the first opening 103. A projection of the first transparent electrode 212 on the substrate 11 at least covers the first channel region 143. The first transparent electrode 212 is the gate of the photosensitive element 102. The first electrode 181 is the source of the photosensitive element 102 and the second electrode 182 is the drain of the photosensitive element 102. Alternatively, the first electrode 181 is the drain of the photosensitive element 102 and the second electrode 182 is the source of the photosensitive element 102. Furthermore, the first transparent electrode 212 covers the bottom surface and the side surface of the first opening, and extends to an upper surface of the third insulating layer 19.

In this embodiment, by setting the photosensitive element 102 as a thin film transistor with the transparent top-gate structure, when light is incident from the side of the first transparent electrode 212, compared with a photosensitive element of a traditional thin film transistor structure, the photosensitive element 102 has a larger light-receiving area, better photosensitive effect, and higher sensitivity.

Embodiment 3

Referring to FIG. 4, in this embodiment, a basic structure of an array substrate is similar to that in Embodiment 1 and Embodiment 2. Similar structures will not be described in detail here. For details, refer to Embodiment 1 and Embodiment 2 above. Compared with the above-mentioned Embodiment 1 and Embodiment 2, a difference in this embodiment is that the first transparent electrode 212 is connected to the first electrode 181 through the third opening 105.

Compared with Embodiment 2, in this embodiment, the source or the drain of the photosensitive element 102 is electrically connected to the gate, which reduces gate signal wirings of the photosensitive element 102 and reduces a space of the array substrate.

In one embodiment, when the array substrate is applied to an LCD display panel with an FFS mode, the array substrate further includes a planarization layer and a common electrode layer. The planarization layer is disposed between the common electrode layer and the second conductive layer. The common electrode layer is disposed between the planarization layer and the third insulating layer.

Figure 5:
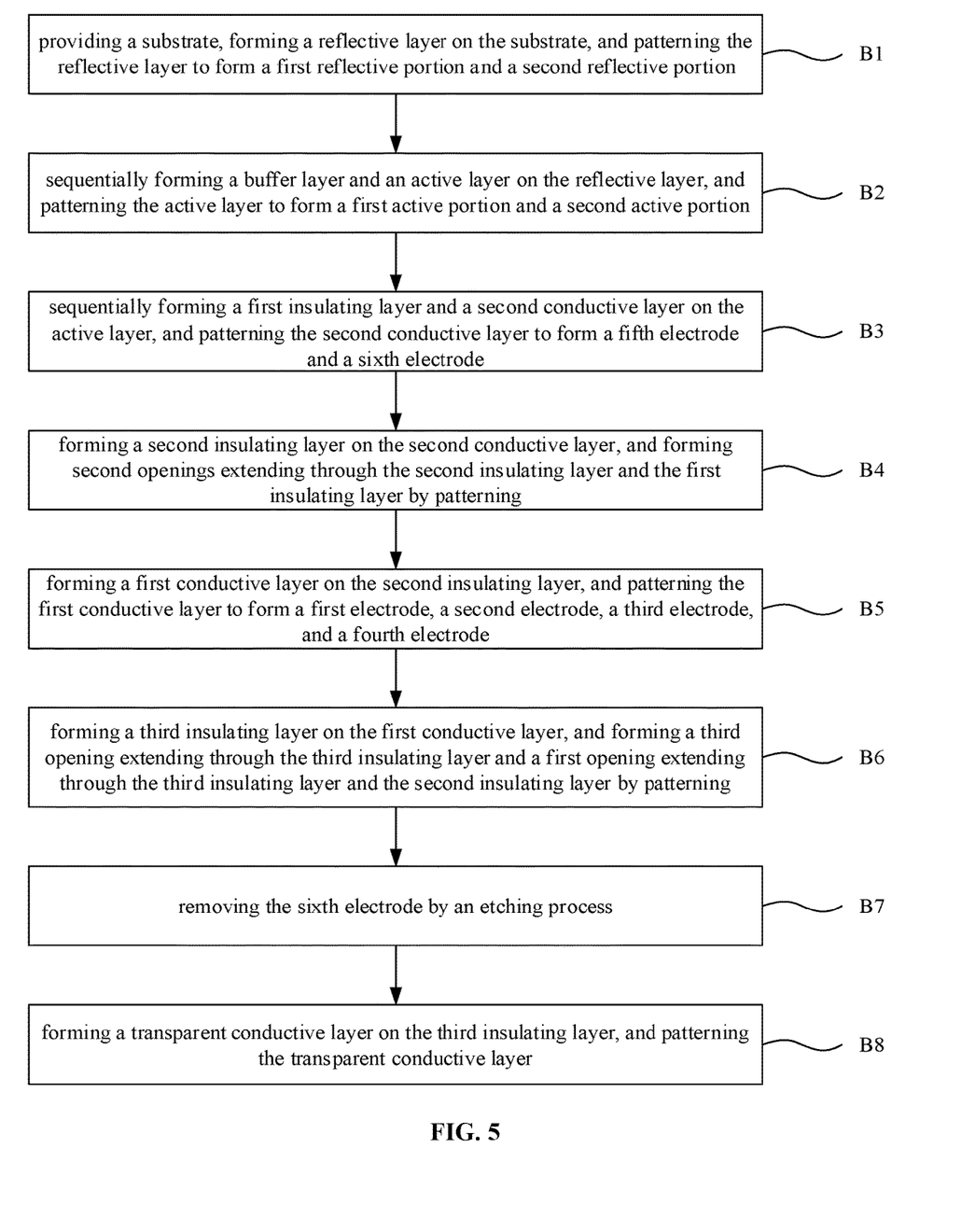
FIG. 5 is a flowchart of a manufacturing method of an array substrate of an embodiment of the present disclosure.
Figure 6:
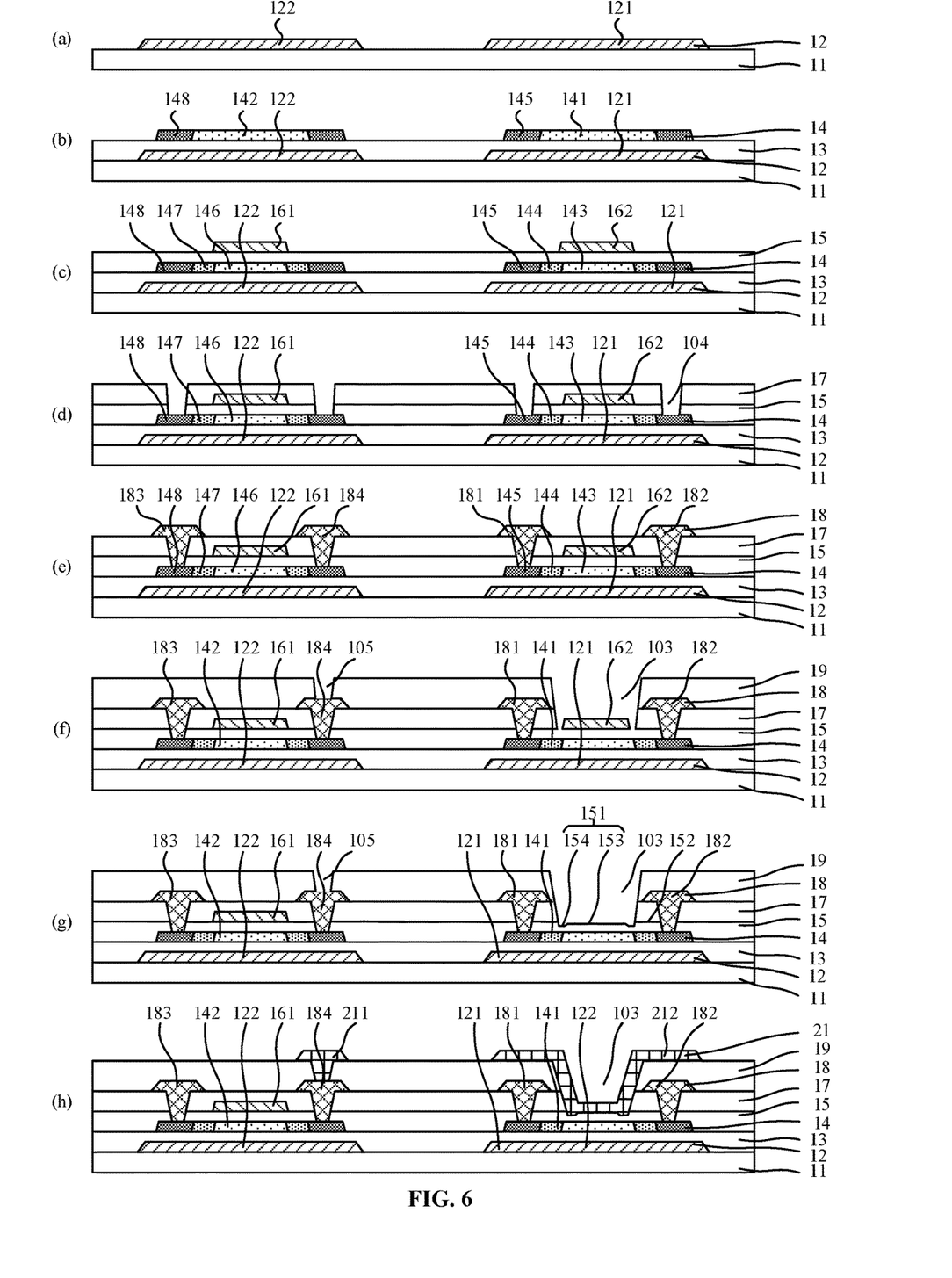
FIG. 6 is a schematic structural diagram of a manufacturing method of an array substrate of an embodiment of the present disclosure.

Correspondingly, embodiments of the present disclosure also provide a manufacturing method of an array substrate for forming the array substrate provided by the embodiments of the present disclosure. Referring to FIG. 5 and FIG. 6, FIG. 5 shows a flowchart of a manufacturing method of an array substrate of an embodiment of the present disclosure, and FIG. 6 shows a schematic structural diagram of a manufacturing method of an array substrate of an embodiment of the present disclosure. The manufacturing method includes:

Step B1, a substrate is provided, a reflective layer is formed on the substrate, and the reflective layer is patterned to form a first reflective portion and a second reflective portion. Specifically, reference may be made to (a) in FIG. 6.

Step B2, a buffer layer and an active layer are sequentially formed on the reflective layer, and the active layer is patterned to form a first active portion and a second active portion. Reference may be made to (b) in FIG. 6 for details. This step specifically includes that the buffer layer 13 is formed on the reflective layer 12, a layer of amorphous silicon is deposited on the buffer layer 13, and the amorphous silicon is converted into polysilicon to form a low temperature polysilicon layer through excimer laser annealing process (ELA). The low temperature polysilicon layer is patterned to form the second active portion 142 and the first active portion 141. Two ends of the first active portion 141 and two ends of the second active portion 142 are heavily doped with phosphorus ions to form first heavily doped regions 145 and second heavily doped regions 148.

Step B3, a first insulating layer and a second conductive layer are sequentially formed on the active layer, and the second conductive layer is patterned to form a fifth electrode and a sixth electrode. A projection of the fifth electrode 161 on the substrate 11 partially overlaps a projection of the second active portion 142 on the substrate 11. A projection of the sixth electrode 162 on the substrate 11 partially overlaps a projection of the first active portion 141 on the substrate 11. Reference may be made to (c) in FIG. 6 for details. After this step, the manufacturing method of the array substrate further includes that the second active portion 142 and the first active portion 141 are lightly doped with phosphorus ions by using the fifth electrode 161 and the sixth electrode 162 as self-aligned masks, respectively, to form second lightly doped regions 147 and first lightly doped regions 144.

Step B4, a second insulating layer is formed on the second conductive layer, and second openings extending through the second insulating layer and the first insulating layer are formed by patterning. The second openings 104 expose the first heavily doped regions 145 and the second heavily doped regions 148, reference may be made to (d) in FIG. 6 for details.

Step B5, a first conductive layer is formed on the second insulating layer, and the first conductive layer is patterned to form a first electrode, a second electrode, a third electrode, and a fourth electrode. The first electrode 181 and the second electrode 182 are electrically connected to the first heavily doped regions 145 through the second openings 104. The third electrode 183 and the fourth electrode 184 are electrically connected to the second heavily doped regions 148 through the second openings 104. Reference may be made to (e) in FIG. 6 for details.

Step B6, a third insulating layer is formed on the first conductive layer, and a third opening extending through the third insulating layer and a first opening extending through the third insulating layer and the second insulating layer are formed by patterning. The third opening exposes the third electrode 183 or the fourth electrode 184. The first opening 103 exposes the sixth electrode 162. Reference may be made to (f) in FIG. 6 for details.

In one embodiment, when the array substrate is applied to an LCD display panel with an FFS mode, between the step B6 and the step B5, the manufacturing method further includes that a planarization layer is formed on the first conductive layer, and a common electrode layer is formed on the planarization layer.

Step B7, the sixth electrode is removed by an etching process, reference may be made to (g) in FIG. 6 for details.

After the etching is completed, in a surface of the first insulating layer 15 away from the substrate 11, a portion corresponding to the first opening 103 is a first surface 151, a portion other than the first surface 151 is a second surface 152, and the second surface 152 surrounds the first surface 151. In the first surface 151, a portion corresponding to the sixth electrode 162 is a third surface 153, and a portion other than the third surface 153 is a fourth surface 154. The fourth surface 154 surrounds the third surface 153, and the second surface 152 surrounds the fourth surface 154.

In an embodiment, the removal of the sixth electrode 162 by the etching process is specifically to remove the sixth electrode 162 by a dry etching process. During the dry etching process, etching gas will etch material of the first insulating layer 15 at the same time. An etching selectivity ratio of the etching gas to the sixth electrode 162 is greater than an etching selectivity ratio of the etching gas to the first insulating layer 15, so that after the sixth electrode 162 is removed by dry etching, the fourth surface 154 is recessed toward the substrate 11 with respect to the second surface 152. In order to ensure that the sixth electrode 162 is completely removed by etching, in general, the third surface 153 is recessed toward the substrate 11 with respect to the second surface 152. A recessed depth of the third surface 153 toward the substrate 11 is less than a recessed depth of the fourth surface 154 toward the substrate 11. The recessed depth of the third surface 153 to the substrate 11 ranges from 50 micrometers to 200 micrometers. The recessed depth of the fourth surface 154 to the substrate 11 ranges from 50 micrometers to 150 micrometers.

In another embodiment, the removal of the sixth electrode 162 by an etching process is specifically to remove the sixth electrode 162 by wet etching using an etching solution formed by mixing phosphoric acid, nitric acid, and acetic acid in a certain proportion. Similarly, in the wet etching process, the etching solution will etch the material of the first insulating layer 15. Compared with the dry etching, the wet etching chemical has a larger selection of etching of the sixth electrode 162. After the sixth electrode is removed by wet etching, the recessed depth of the fourth surface 154 to the substrate 11 is small.

Step B8, a transparent conductive layer is formed on the third insulating layer, and the transparent conductive layer is patterned.

In the first embodiment, the patterning of the transparent conductive layer 21 is to form the second transparent electrode 211. The second transparent electrode 211 is electrically connected to the third electrode 183 or the fourth electrode 184 through the third opening. Reference may be made to FIG. 1 for details.

In the second embodiment, the patterning of the transparent conductive layer 21 is to form the second transparent electrode 211 and the first transparent electrode 212. The second transparent electrode 211 is connected to the third electrode 183 or the fourth electrode 184 through the third opening. The first transparent electrode 212 covers the bottom and side walls of the first opening. Reference may be made to (h) in FIG. 6 and FIG. 2 for details.

In the third embodiment, the patterning of the transparent conductive layer 21 is to form the second transparent electrode 211 and the first transparent electrode 212. The second transparent electrode 211 is connected to the third electrode 183 or the fourth electrode 184 through the third opening. The first transparent electrode 212 is electrically connected to the first electrode 181 or the second electrode 182 through the third opening. The first transparent electrode 212 covers the bottom and side walls of the first opening. Reference may be made to FIG. 3 for details.

In the manufacturing method of the array substrate of the embodiments of the present disclosure, the pixel driving element is set as a thin film transistor with a top gate structure, the photosensitive element is set as a thin film transistor with a transparent top gate structure or a photosensitive diode, and the semiconductor structures of the pixel driving element and the photosensitive element are both low temperature polysilicon materials. On the basis of not increasing the number of photomasks, the integration of the pixel driving element and the photosensitive element on the same array substrate is realized. At the same time, the first opening is formed in the photosensitive element. The first opening corresponds to the semiconductor structure of the photosensitive element. The light incident side of the photosensitive element is a transparent film layer structure or a filmless structure. Compared with the traditional photosensitive device, the photosensitive element provided by the embodiments of the present disclosure has a larger light-receiving area, better photosensitive effect, and higher sensitivity.

Meanwhile, an embodiment of the present disclosure provides a display panel. The display panel includes the array substrate described in any one of the embodiments of the present disclosure. Since the display panel includes the array substrate described in any one of the embodiments of the present disclosure, it has the technical features and beneficial effects of the array substrate described in any one of the embodiments of the present disclosure. For details, refer to the above-mentioned embodiments related to the array substrate, which will not be repeated here. The display panel includes, but is not limited to, an LCD display panel, an OLED display panel, an LED display panel, a MLED display panel, and the like.

In summary, the embodiments of the present disclosure provide the array substrate and the display panel. By arranging the semiconductor structure of the pixel driving element and the semiconductor structure of the photosensitive element in the same active layer, the integration of the pixel driving element and the photosensitive element on the array substrate is realized. Meanwhile, the first opening is formed in the photosensitive element, and the first opening corresponds to the semiconductor structure of the photosensitive element. A photosensitive area of the photosensitive element and a light transmittance of a photosensitive side of the photosensitive element are improved, thereby improving the photosensitive performance of the photosensitive element.

The array substrate and the display panel provided by the embodiments of the present disclosure are described in detail above. The principles and implementations of the present disclosure are explained with specific examples in this specification. The descriptions of the above embodiments are only used to help understand the method and the core idea of the present disclosure. For those skilled in the art, according to the idea of the present disclosure, there will be changes in the specific implementation manner and application scope. In conclusion, the content of this specification should not be construed as a limitation on the present disclosure.

What is claimed is:

1. An array substrate, comprising:
   a substrate;
   an active layer disposed on a side of the substrate and comprising a first active portion and a second active portion; and
   a first insulating layer disposed on a side of the active layer away from the substrate and covering the active layer, wherein the first active portion is formed with a first opening exposing the first insulating layer, the array substrate further comprises a second insulating layer and a third insulating layer, the second insulating layer and the third insulating layer are sequentially arranged on the first insulating layer, and the first opening extends through the second insulating layer and the third insulating layer, wherein the array substrate further comprises a transparent conductive layer, the transparent conductive layer is disposed on the third insulating layer, the transparent conductive layer comprises a first transparent electrode, and the first transparent electrode covers the first opening, wherein a surface of the first insulating layer away from the substrate comprises a first surface and a second surface, the first surface is a bottom surface of the first opening, the second surface surrounds the first surface, and the first surface is recessed relative to the second surface, and wherein the first surface comprises a third surface and a fourth surface, the fourth surface surrounds the third surface, the second surface surrounds the fourth surface, the fourth surface is recessed relative to the third surface and the second surface, and the third surface is recessed relative to the second surface.

2. The array substrate according to claim 1, wherein a recessed depth of the fourth surface relative to the second surface ranges from 50 micrometers to 200 micrometers, and a recessed depth of the third surface relative to the second surface ranges from 50 micrometers to 150 micrometers.

3. The array substrate according to claim 1, wherein the first active portion is further provided with a second opening, the second opening extends through the first insulating layer and the second insulating layer, and exposes the first active portion, and an opening diameter of the first opening is greater than an opening diameter of the second opening.

4. The array substrate according to claim 3, wherein the third insulating layer is provided with a third opening, the third opening extends through the third insulating layer, and the opening diameter of the first opening is greater than an opening diameter of the third opening.

5. The array substrate according to claim 4, wherein the array substrate further comprises a first conductive layer, the first conductive layer comprises a first electrode and a second electrode, and the first electrode and the second electrode are respectively connected to both ends of the first active portion through the second openings.

6. The array substrate according to claim 5, wherein the first conductive layer further comprises a third electrode and a fourth electrode, and the third electrode and the fourth electrode are respectively connected to both ends of the second active portion through the second openings.

7. The array substrate according to claim 6, wherein the transparent conductive layer further comprises a second transparent electrode, and the second transparent electrode is connected to the third electrode or the fourth electrode through the third opening.

8. The array substrate according to claim 7, wherein the first transparent electrode is electrically connected to the first electrode or the second electrode.

9. The array substrate according to claim 8, wherein the first transparent electrode covers a bottom surface and a side surface of the first opening and extends to a surface of the third insulating layer, and the first transparent electrode is connected to the first electrode or the second electrode through the third opening.

10. The array substrate according to claim 6, wherein the array substrate further comprises a second conductive layer, the second conductive layer is disposed between the first insulating layer and the second insulating layer, the second conductive layer comprises a fifth electrode, and a projection of the fifth electrode on the substrate partially overlaps a projection of a channel region of the second active portion on the substrate.

11. The array substrate according to claim 1, wherein the first active portion comprises a first channel region and two first doped regions, the two first doped regions are respectively arranged on both sides of the first channel region, and a projection of a bottom surface of the first opening on the substrate covers a projection of the first channel region on the substrate.

12. The array substrate according to claim 1, wherein the array substrate further comprises a reflective layer disposed between the substrate and the active layer, the reflective layer comprises a first reflective portion, and a projection of the first active portion on the substrate is within a projection of the first reflective portion on the substrate.

13. The array substrate according to claim 12, wherein the reflective layer further comprises a second reflective portion, and a projection of the second active portion on the substrate is within a projection of the second reflective portion on the substrate.

14. The array substrate according to claim 1, wherein the array substrate comprises a pixel driving element and a photosensitive element, the photosensitive element comprises the first active portion, and the pixel driving element comprising the second active portion.

15. The array substrate according to claim 1, wherein material of the active layer is a low temperature polysilicon layer.

* * * * *